United States Patent
Maeda et al.

(10) Patent No.: US 7,570,297 B2
(45) Date of Patent: Aug. 4, 2009

(54) METHOD FOR MANUFACTURING CAMERA MODULE WHERE A SOLID STATE IMAGING DEVICE IS AN ASSEMBLY REFERENCE PLANE OF AN OPTICAL UNIT

(75) Inventors: Hiroshi Maeda, Kanagawa (JP); Shigehisa Shimizu, Kanagawa (JP); Kazuhiro Nishida, Kanagawa (JP)

(73) Assignee: FUJIFILM Corporation, Tokyo (JP)

( * ) Notice: Subject to any disclaimer, the term of this patent is extended or adjusted under 35 U.S.C. 154(b) by 800 days.

(21) Appl. No.: 10/839,231

(22) Filed: May 6, 2004

(65) Prior Publication Data

US 2004/0223072 A1 Nov. 11, 2004

(30) Foreign Application Priority Data

May 8, 2003 (JP) ............................. 2003-130599

(51) Int. Cl.
*H04N 5/225* (2006.01)
(52) U.S. Cl. ...................................... 348/340
(58) Field of Classification Search ................. 348/340
See application file for complete search history.

(56) References Cited

U.S. PATENT DOCUMENTS

| | | | |
|---|---|---|---|
| 4,942,539 A | 7/1990 | McGee et al. | |
| 5,749,827 A * | 5/1998 | Minami ..................... | 600/109 |
| 6,156,587 A | 12/2000 | Kayanuma et al. | |
| 6,476,417 B2 * | 11/2002 | Honda et al. ............... | 257/59 |
| 6,727,564 B2 * | 4/2004 | Shinomiya ................. | 257/432 |
| 6,762,796 B1 * | 7/2004 | Nakajoh et al. ............. | 348/340 |
| 7,074,638 B2 | 7/2006 | Maeda et al. | |
| 7,242,433 B2 * | 7/2007 | Tanaka et al. ............... | 348/340 |
| 7,333,147 B2 * | 2/2008 | Adachi et al. ............... | 348/374 |
| 7,391,457 B2 * | 6/2008 | Fujimoto et al. ............ | 348/340 |
| 2001/0050721 A1 * | 12/2001 | Miyake ...................... | 348/374 |
| 2001/0055073 A1 * | 12/2001 | Shinomiya .................. | 348/374 |
| 2002/0167605 A1 | 11/2002 | Akimoto et al. | |
| 2003/0025825 A1 | 2/2003 | Nakajoh | |
| 2003/0057359 A1 | 3/2003 | Webster | |
| 2003/0164891 A1 * | 9/2003 | Akimoto ..................... | 348/340 |
| 2004/0223072 A1 * | 11/2004 | Maeda et al. ............... | 348/340 |

FOREIGN PATENT DOCUMENTS

| | | |
|---|---|---|
| EP | 0 773 673 A1 | 5/1997 |
| EP | 1 148 716 A1 | 10/2001 |
| JP | 5-102448 A | 4/1993 |
| JP | 11-252416 A | 9/1999 |

* cited by examiner

*Primary Examiner*—Tuan V Ho
*Assistant Examiner*—Kent Wang
(74) *Attorney, Agent, or Firm*—Sughrue Mion, PLLC (57) ABSTRACT

A cover glass covers only light-receiving elements formed on a semiconductor substrate of a solid-state imaging device. The other area of the substrate except the light-receiving elements is exposed. An FPC interposed between an optical unit and the solid-state imaging device is formed with an opening for exposing the cover glass and an assembly reference surface of the solid-state imaging device. When the solid-state imaging device is attached to the optical unit, the center of the light-receiving elements is determined as a reference position. The optical unit is directly attached to the assembly reference surface so as to make the reference position coincide with a photographic optical axis of the optical unit.

9 Claims, 12 Drawing Sheets

METHOD FOR MANUFACTURING CAMERA MODULE WHERE A SOLID STATE IMAGING DEVICE IS AN ASSEMBLY REFERENCE PLANE OF AN OPTICAL UNIT

BACKGROUND OF THE INVENTION

1. Field of the Invention

The present invention relates to a solid-state imaging device, a camera module and a manufacturing method for the camera module, wherein a thickness in an optical-axis direction is thin and it is possible to assemble the solid-state imaging device and an optical unit with great accuracy.

2. Description of the Related Art

A digital camera and a video camera employing a solid-state imaging device are widely used. Further, it is also done to add a photographing function to a personal computer and electronic equipments of a cellular phone, an electronic notebook and so forth by incorporating the solid-state imaging device and a memory therein. In order to easily add the photographing function to the electronic equipments except the digital camera, is provided a unitized camera module in which the solid-state imaging device, an optical unit and a circuit board are assembled in advance. The optical unit has a built-in imaging optical system, and the circuit board is provided with a control circuit.

The solid-state imaging device comprises a light-receiving element and an external connection terminal, which are formed on a semiconductor substrate made from silicon. In case the solid-state imaging device is in a state that the light-receiving element is not protected, namely in case the solid-state imaging device is a bare chip, dust and dart adhere to the light-receiving element and a trouble is caused. Therefore, in the conventional solid-state imaging device, the bare chip is contained in a package formed from ceramic and so forth. The solid-state imaging device and the package are connected by wire bonding. A cover glass is attached to an opening of the package to supply the solid-state imaging device in a sealed state.

As to one of mounting manners for downsizing the solid-state imaging device, there is a chip-size package (hereinafter, abbreviated as CSP) structure wherein mounting the solid-state imaging device is completed without using the package (see U.S. Pat. No. 7,074,638). The solid-state imaging device of the CSP type is provided with a spacer, which is disposed on an upper surface of the semiconductor substrate so as to surround the light-receiving element. A cover glass is attached to the top of the spacer to seal the light-receiving element.

In order to obtain a high-quality photographic picture by effectively utilizing performance of the solid-state imaging device, it is necessary to make a photographic optical axis of the imaging optical system coincide with the center of a light-receiving area of the solid-state imaging device. Further, it is also necessary to make the light-receiving element of the solid-state imaging device perpendicular to the photographic optical axis of the imaging optical system. If the photographic optical axis of the imaging optical system does not coincide with the center of the light-receiving area of the solid-state imaging device, shading and so forth occur due to a decline of a light amount, deterioration of resolution, and unevenness of sensitivity. Moreover, if the solid-state imaging device inclines relative to the photographic optical axis, it is impossible to obtain a proper image due to a condition of so-called "swing-and-tilt photographing".

In a conventional way, image pickup is performed with the solid-state imaging device during an assembly operation for the purpose of assembling the solid-state imaging device and the optical unit with great accuracy. A pickup image is viewed to carry out an operation (aligning operation) for deciding relative positions of the solid-state imaging device and the imaging optical system. The aligning operation, however, takes a lot of time so that it is caused to increase the cost and to deteriorate a yield rate.

In order to accurately assemble the solid-state imaging device and the optical unit without the above-mentioned aligning operation, a plurality of positioning plates are attached to the outside of the package of the solid-state imaging device described in Japanese Patent Laid-Open Publication No. 05-102448. By using the positioning plates, the solid-state imaging device is positioned and fixed to the optical unit. Meanwhile, with respect to the solid-state imaging device described in Japanese Patent Laid-Open Publication No. 11-252416, an attachment reference plane is accurately formed on the package. The attachment reference plane abuts on a reference plane of the optical unit to carry out positioning and fixing.

As to the solid-state imaging device sealed in the package, positioning accuracy thereof relative to the optical unit is affected by size accuracy of the package, assembly accuracy of the solid-state imaging device and the package, and assembly accuracy of the package and the optical unit. Therefore, even if the package is attached to the optical unit with great accuracy, positional accuracy of the solid-state imaging device and the optical unit is not greatly improved. The aligning operation is still required to carry out appropriate positioning.

The solid-state imaging device sealed in the package has a broad external size (project area perpendicular to an optical-axis direction) and a wide size in the optical-axis direction (thickness size). Thus, the digital camera and the camera module, in which the solid-state imaging device is incorporated, are prevented from being downsized.

SUMMARY OF THE INVENTION

In view of the foregoing, it is a primary object of the present invention to provide a solid-state imaging device whose size is reduced.

It is a second object of the present invention to provide a camera module whose size is reduced.

It is a third object of the present invention to provide a camera-module producing method in which an aligning operation is unnecessary at the time of assembling a solid-state imaging device and an optical unit.

In order to achieve the above and other objects, the solid-state imaging device according to the present invention comprises light-receiving elements formed on a first surface of a semiconductor substrate. A translucent member covers only the light-receiving elements so as to expose the other area of the semiconductor substrate except the light-receiving elements. An external connection terminal is formed on a second surface of the semiconductor substrate, which is opposite to the first surface thereof. A wiring member electrically connects the light-receiving element and the external connection terminal.

A planar accuracy of the semiconductor substrate is extremely high. Thus, when the semiconductor substrate of the solid-state imaging device is exposed, it is possible to utilize the first surface of the semiconductor substrate as an assembly reference plane at the time of combining the solid-state imaging device and the optical unit during manufacture of a camera module.

The optical unit is directly attached to the first surface of the semiconductor substrate. In virtue of this, there is no factor for deteriorating assembly accuracy of the first surface and the optical unit so that it is possible to construct the camera module with great accuracy. Similarly, the translucent member for covering the light-receiving element is also processed with great accuracy and is attached to the semiconductor substrate. Therefore, even if the optical unit is attached to the translucent member, equivalent accuracy may be obtained in comparison with the case in that the optical unit is attached to the semiconductor substrate.

A circuit board provided with a circuit for driving the solid-state imaging device is disposed between the solid-state imaging device and the optical unit. Alternatively, the circuit board is attached to the opposite surface of the solid-state imaging device on which the light-receiving element is not formed. It is possible to properly select the attachment position of the circuit board in accordance with forms and assembly positions of the solid-state imaging device and the camera module. Further, the circuit board may be folded so as to be disposed under the solid-state imaging device. In this case, a project area is reduced on a plane perpendicular to a photographic optical axis of the optical unit. By the way, instead of the circuit board, electronic components may be directly mounted on the solid-state imaging device.

For attaching the solid-state imaging device to the optical unit, are executed the steps of obtaining image data by imaging the solid-state imaging device with an electronic camera, determining a reference position of the solid-state imaging device from the image data, carrying out positioning on a plane perpendicular to the photographic optical axis so as to make the reference position of the solid-state imaging device coincide with a predetermined reference position of the optical unit, and fixing the solid-state imaging device to the optical unit. It is possible to accurately assemble the camera module without using an output image of the solid-state imaging device such as performed in the conventional way.

BRIEF DESCRIPTION OF THE DRAWINGS

The above objects and advantages of the present invention will become apparent from the following detailed description of the preferred embodiments of the invention when read in conjunction with the accompanying drawings, in which.

DETAILED DESCRIPTION OF THE PREFERRED EMBODIMENT(S)

Figure 1:
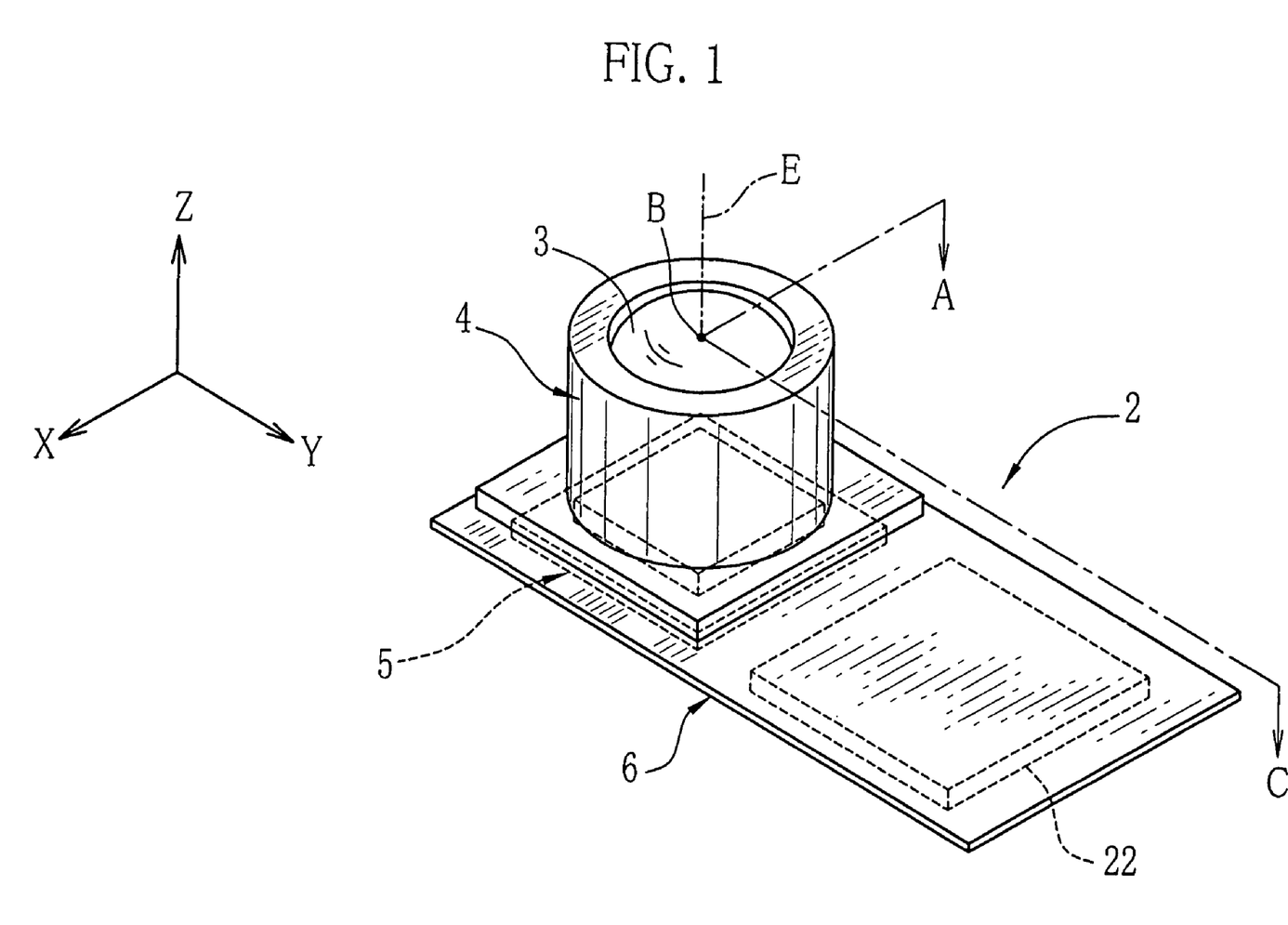
FIG. 1 is a perspective view showing a camera module of a first embodiment according to the present invention.
Figure 2:
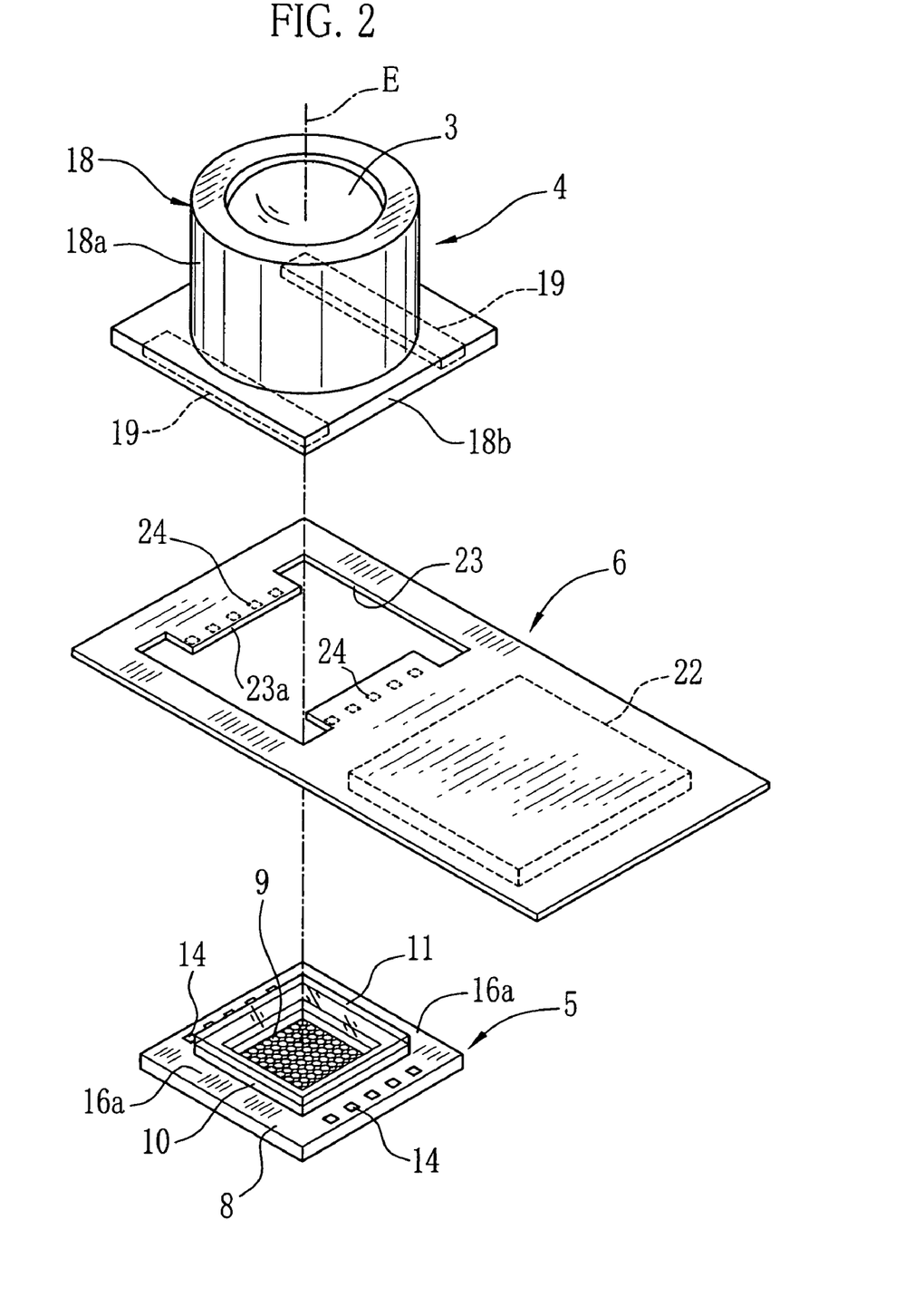
FIG. 2 is an exploded perspective view showing the camera module of the first embodiment.
Figure 3:
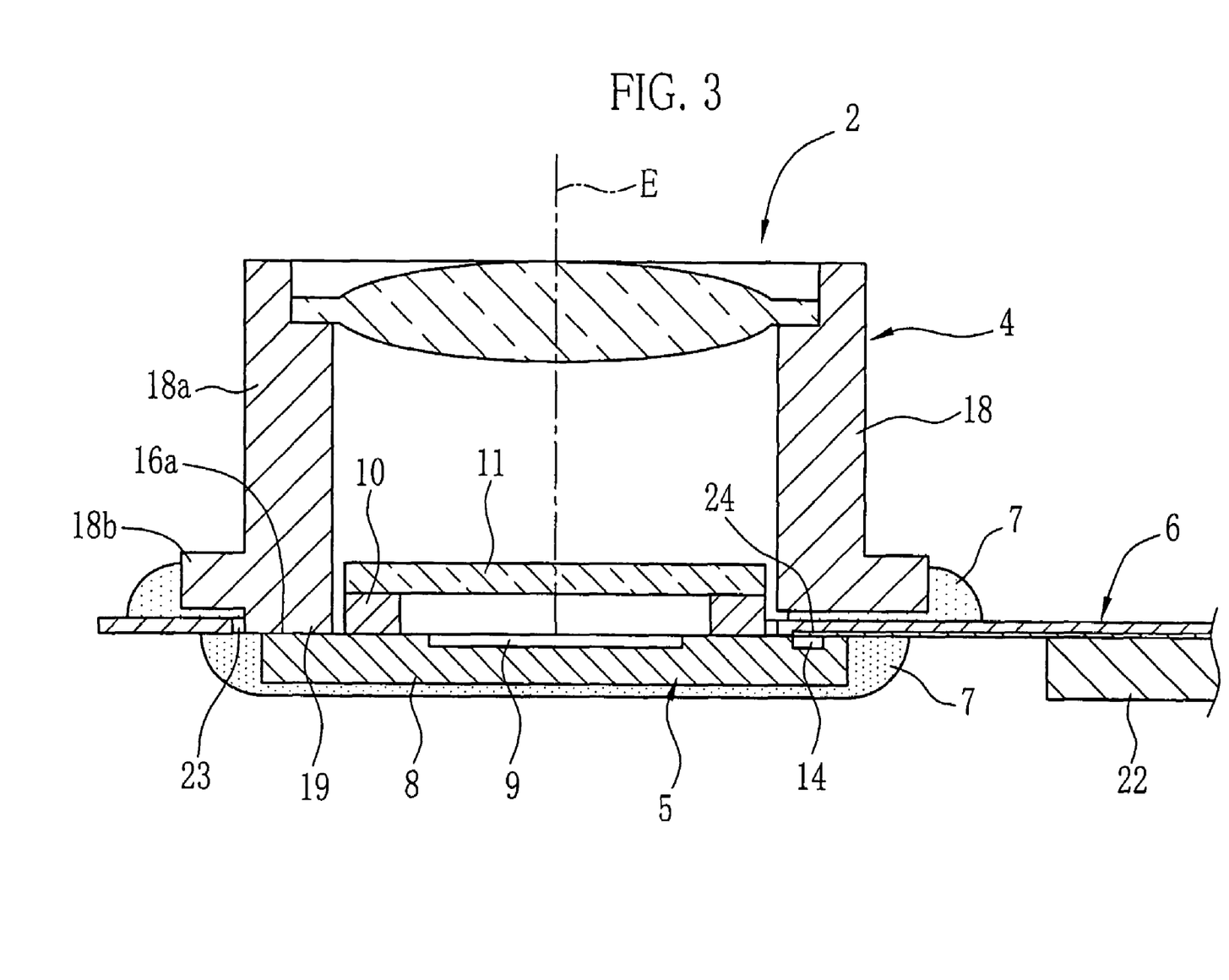
FIG. 3 is a partial section view showing the camera module of the first embodiment.

FIG. 1 is a perspective view of a camera module according to the present invention, and FIG. 2 is an exploded perspective view thereof. FIG. 3 is a section view of a line A-B-C shown in FIG. 1. In FIG. 3, a left side of a photographic optical axis E is a section view in an X-direction, and a right side thereof is a section view in a Y-direction. A camera module 2 comprises an optical unit 4 containing an imaging lens 3, a solid-state imaging device 5 disposed behind a photographic optical axis E of the optical unit 4, and a flexible printed circuit board (FPC) 6 attached to the solid-state imaging device 5 between the optical unit 4 and the solid-state imaging device 5. Incidentally, although illustration is omitted in FIG. 1 for the purpose of avoiding complication, sealing is performed by plastic 7 between the optical unit 4 and the FPC 6 and between the solid-state imaging device 5 and the FPC 6.

The solid-state imaging device 5 employs a CCD, for instance. The solid-state imaging device 5 has a CSP structure without using a package, and light-receiving elements 9 are provided on a semiconductor substrate 8 having a rectangular shape. A frame-shaped spacer 10 is attached to a surface of the semiconductor substrate 8, on which the light-receiving elements 9 are formed, by an adhesive or the like so as to surround the light-receiving elements 9. On the spacer 10, a cover glass 11 is disposed. The cover glass 11 is a translucent member for covering the light-receiving elements 9.

Figure 4:
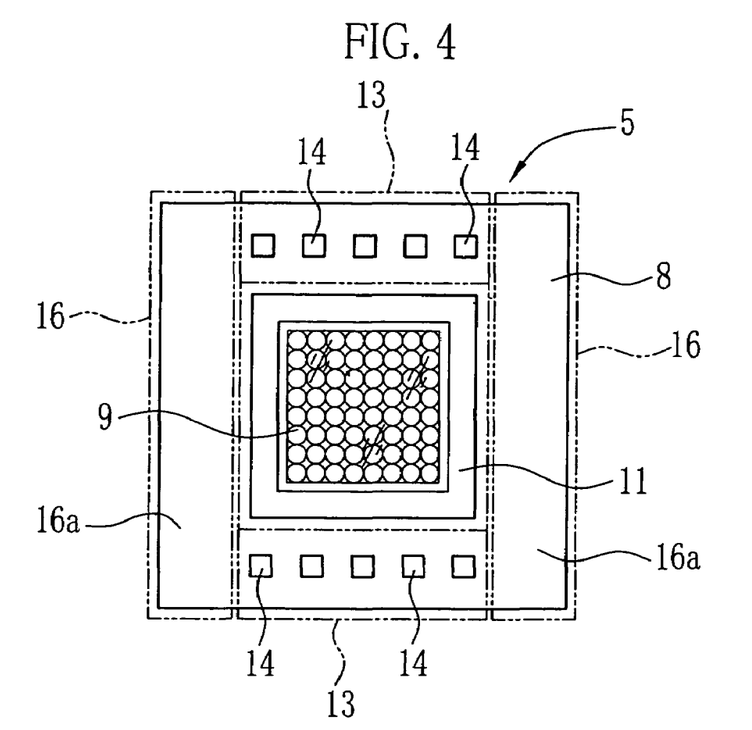
FIG. 4 is a plan view of a solid-state imaging device used in the first embodiment.

FIG. 4 is a plan view of the solid-state imaging device 5. Such as shown in FIG. 4, pair of edge portions oppositely arranged on the upper surface of the semiconductor substrate 8 are terminal areas 13 to be externally connected. Within the respective areas 13, are provided external connection terminals 14 for electrically connecting the solid-state imaging device 5 and the FPC 6. The external connection terminal 14 is provided with an Au bump and so forth to mount the solid-state imaging device 5 on the FPC 6 in Flip Chip (FC) mounting.

Another pair of edge portions, which are perpendicular to the terminal area 13, are terminal non-forming areas 16 wherein there is no terminal to be externally connected. There is nothing on a surface 16a of the terminal non-forming area 16 so that the surface 16a has accurate flatness of the time when the semiconductor substrate 8 has been divided from a wafer. Thus, the surface 16a of the terminal non-forming area 16 may be used as a reference plane for assembly, without additional processing, when the optical unit 4 and the solid-state imaging device 5 are combined.

The optical unit 4 comprises a lens holder 18 and the imaging lens 3 contained therein. The lens holder 18 is made from a plastic, for example. A cylindrical lens barrel 18a for containing the imaging lens 3 is integrally formed with a rectangular base 18b located at a lower end of the lens barrel 18a. A lower surface of the base 18b is formed with a pair of rectangular protrusions 19 to be fixed to the reference surfaces 16a of the solid-state imaging device 5 by an adhesive or the like.

The FPC 6 has a rectangular form. The solid-state imaging device 5 is placed at one side of the FPC 6, and the other side of which, an IC 22 for driving the solid-state imaging device 5 is mounted. The IC 22 works as an analog front end circuit wherein H driver (V driver), CDS, AGC, ADC and so forth are incorporated into a single chip, for example. The side of the FPC 6 to which the solid-state imaging device 5 is fixed is formed with an opening 23 having a size for exposing both of the cover glass 11 of the solid-state imaging device 5 and the terminal non-forming areas 16a. The opening 23 is provided with a pair of opposite edge portions 23a. A lower surface of the edge portion 23a is formed with electrodes 24 to be connected to the external connection terminals 14 of the solid-state imaging device 5.

Figure 5:
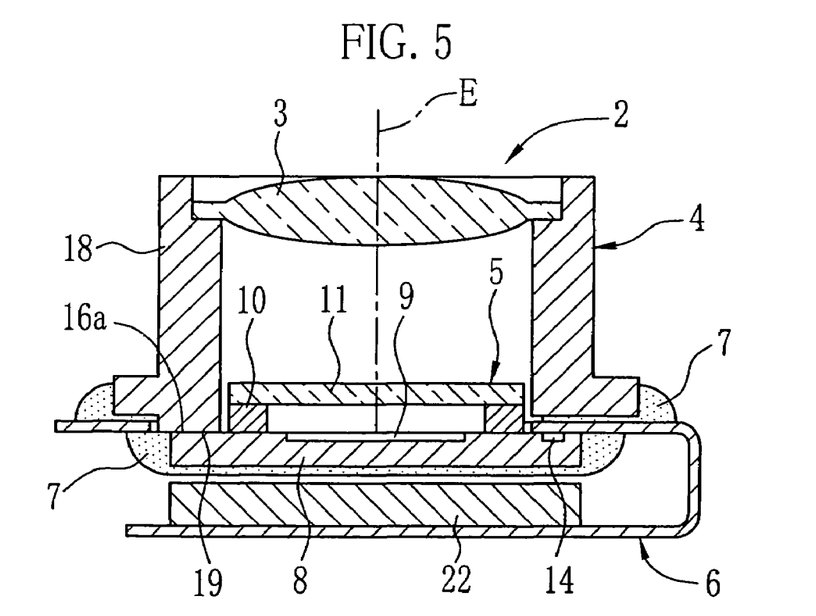
FIG. 5 is a partial section view showing a state in that FPC is bent in the camera module of the first embodiment.

The FPC 6 is disposed between the optical unit 4 and the solid-state imaging device 5, but is not caught between them. Therefore, a thickness of the FPC 6 and thicknesses of the IC 22 and so forth attached to the FPC 6 do not affect a measure of the optical unit 4 and the solid-state imaging device 5 in a direction of the optical axis E. Incidentally, such as shown in FIG. 5, when the FPC 6 is bent so as to dispose the IC 22 under the solid-state imaging device 5, it is possible to extremely reduce a project area on a perpendicular plane to the direction of the optical axis E even though a measure of the camera module 2 increases by a little in the direction of the optical axis E. As to the circuit board, the FPC is not exclusive. Plate-shaped boards of a popular glass-epoxy board, a ceramic board and so forth may be used. The plate-shaped board may be constituted of a plurality of board members connected by jumper cables, and the board member may be disposed under the solid-state imaging device 5 by bending the jumper cable.

Figure 6:
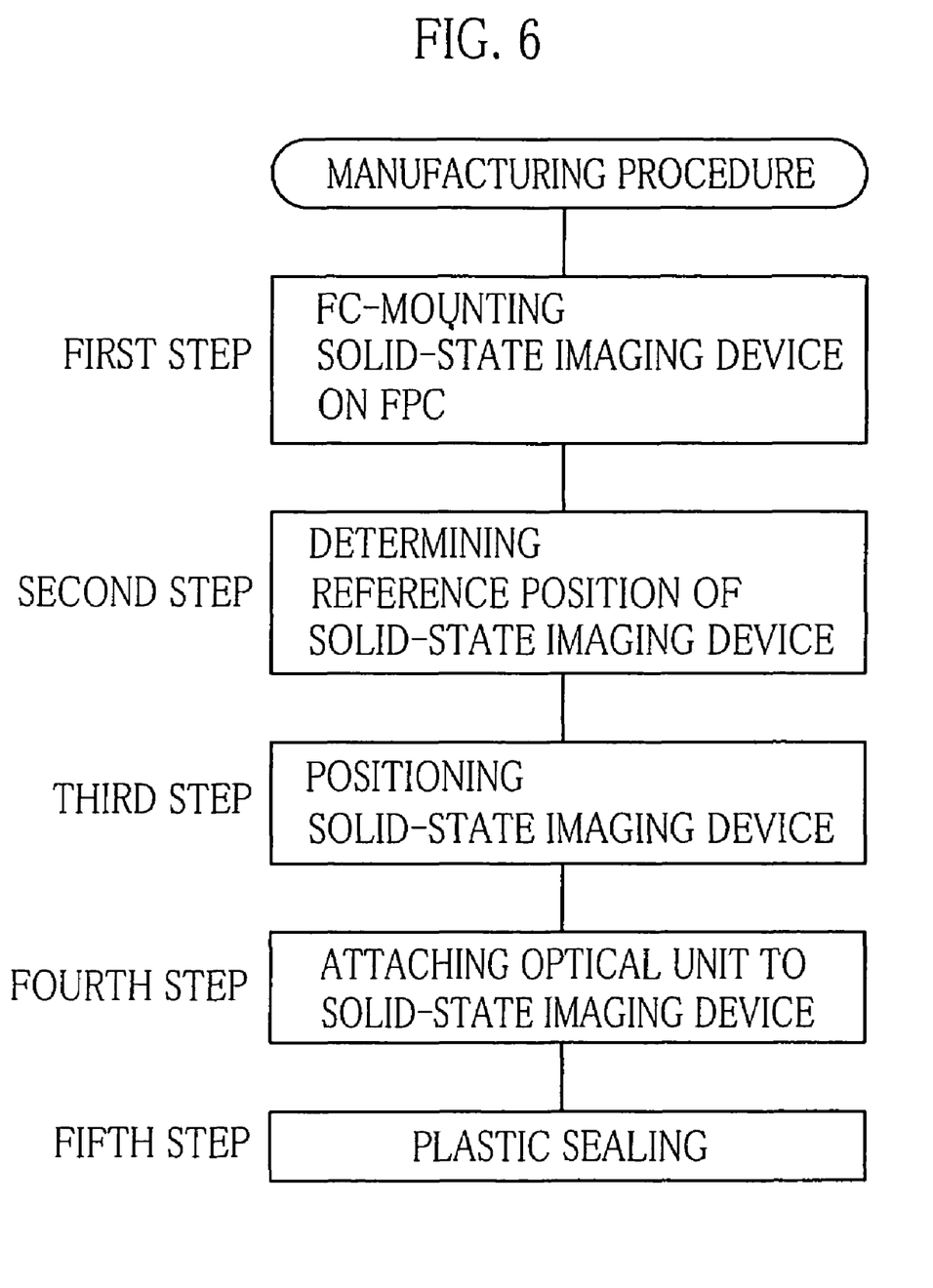
FIG. 6 is a flowchart showing a procedure for manufacturing the camera module of the first embodiment.

The camera module described in the above is manufactured along a procedure of a flowchart shown in FIG. 6. First of all, the FPC 6 is put from the upside of the solid-state imaging device 5 at the first step. The cover glass 11 of the solid-state imaging device 5 and the terminal non-forming areas 16 are exposed through the opening 23 of the FPC 6. At this time, the external connection terminal 14 of the solid-state imaging device 5 overlaps with the electrode 24 so as to be electrically connected. In this way, the solid-state imaging device 5 is FC-mounted on the FPC 6.

The optical unit 4 and the solid-state imaging device 5 are set to an assembly apparatus for positioning and combining them. At the next second step, a reference position of the solid-state imaging device 5 is determined in the assembly apparatus. The reference position is a center position of a light-receiving area of the light-receiving elements 9, for example.

Figure 7:
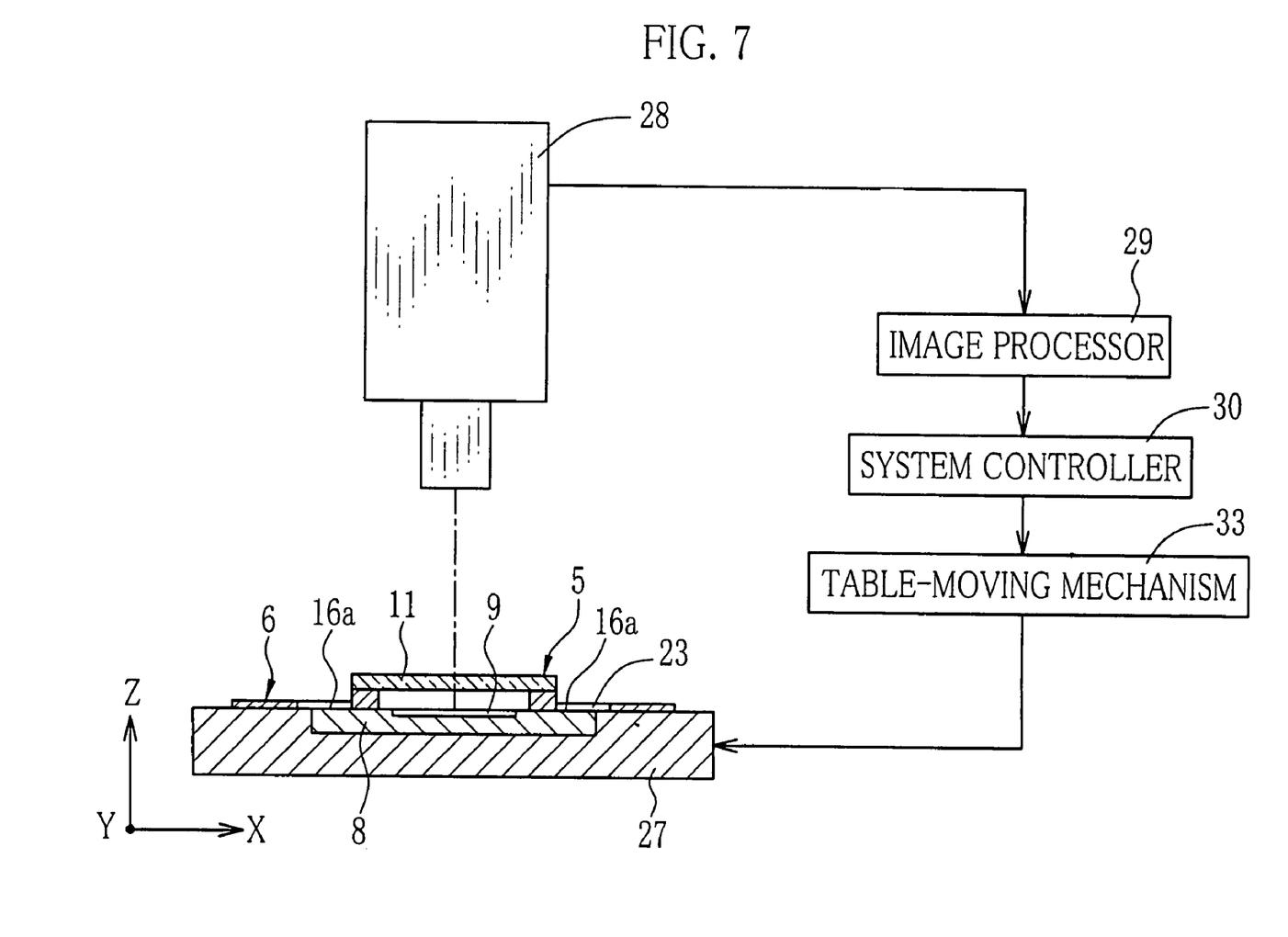
FIG. 7 is an explanatory illustration showing a state in that a reference position of the solid-state imaging device is determined during the procedure for manufacturing the camera module of the first embodiment.

As shown in FIG. 7, the solid-state imaging device 5 mounted on the FPC 6 is positioned and retained on an XYZ table 27, which is movable in directions of X-axis, Y-axis and Z-axis. In the drawing, the X-axis direction is a right-and-left direction, and the Z-axis direction is an up-and-down direction. The Y-axis direction is perpendicular to the X-axis direction. A well-known electronic camera 28 of a TV camera, a digital camera and so forth images the surface of the solid-state imaging device 5 on which the light-receiving elements 9 are provided. Image data outputted from the electronic camera 28 is inputted into an image processor 29 comprising a computer and so forth, and is processed to calculate the center position of the light-receiving area of the light-receiving elements 9. The calculated center position of the light-receiving elements 9 is inputted into a system controller 30 for controlling the assembly apparatus.

Figure 8:
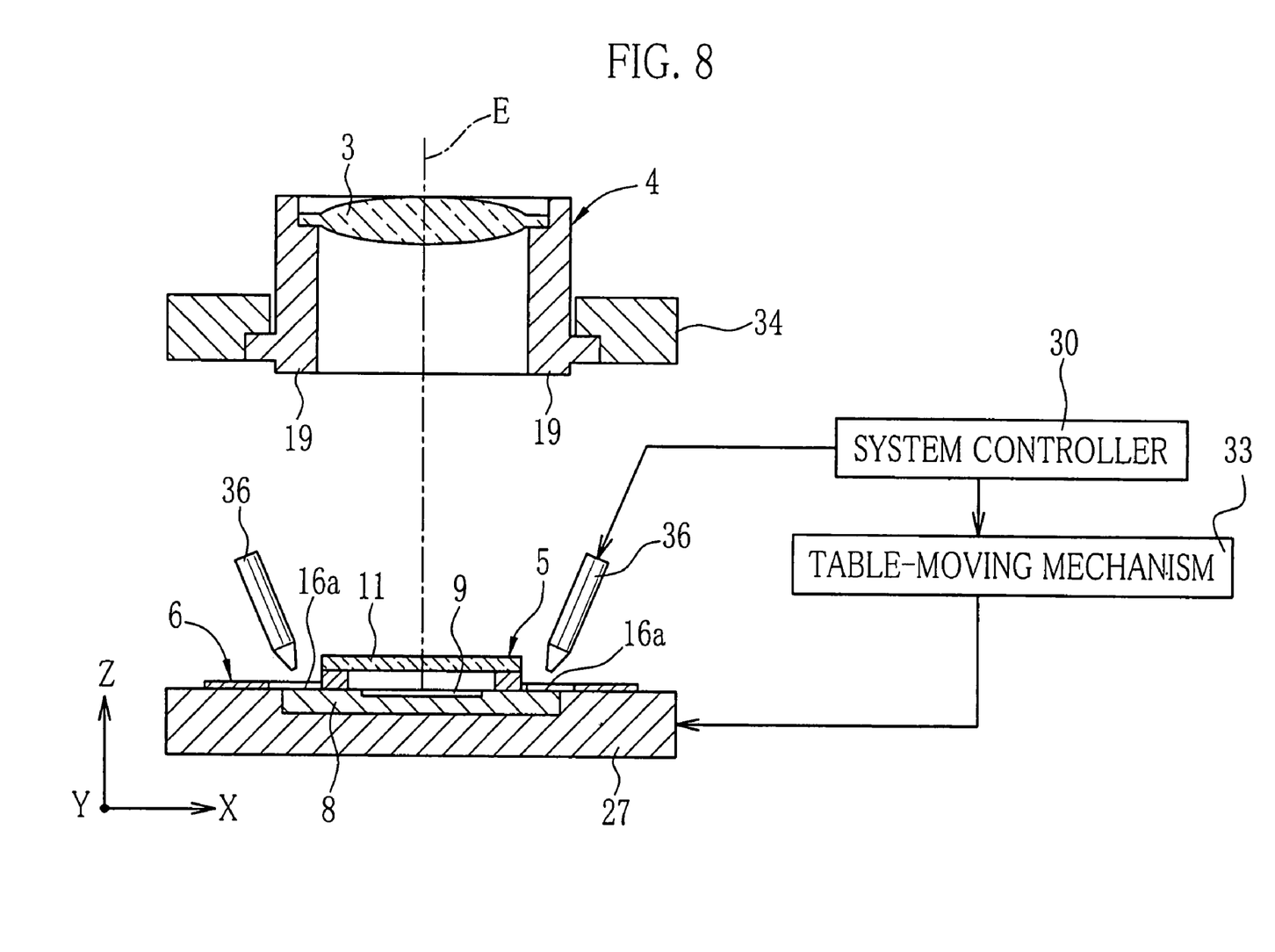
FIG. 8 is an explanatory illustration showing a state in that the solid-state imaging device is positioned and adhesive is applied during the procedure for manufacturing the camera module.

As shown in FIG. 8, at the next third step, the system controller 30 controls a well-known table moving mechanism 33, which comprises a ball thread, a motor and so forth, to move the XYZ table 27. Positioning is performed so as to make the center position of the light-receiving area of the light-receiving elements 9 coincide with the photographic optical axis E of the imaging lens 3 of the optical unit 4 in the Z-axis direction.

When the optical unit 4 is manufactured, the photographic optical axis E of the imaging lens 3 is determined, and the imaging lens 3 is fitted into the lens barrel 18a so as to set the photographic optical axis E to a predetermined position relative to an outer shape of the lens holder 18. In virtue of this, by retaining the lens holder 18 at a predetermined position with a positioning member 34, the position of the photographic axis E may be defined inside the assembly apparatus.

At the next fourth step, the solid-state imaging device 5 is attached to the optical unit 4. Dispensers 36 for the adhesive are disposed near the stop position of the stationed solid-state imaging device 5. The dispenser 36 supplies and applies the adhesive to the assembly reference surface 16a of the solid-state imaging device 5.

Figure 9:
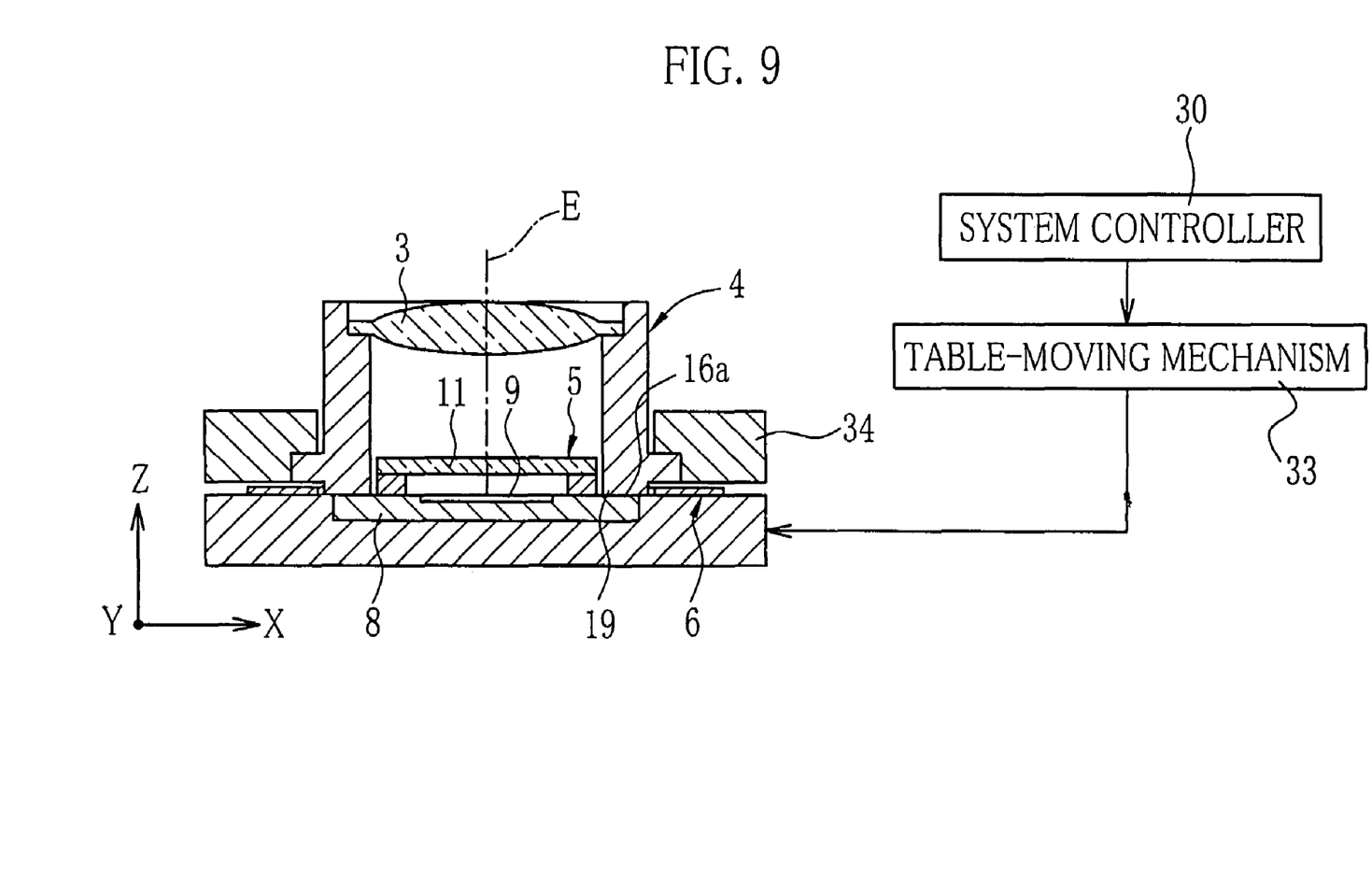
FIG. 9 is an explanatory illustration showing a state in that the solid-state imaging device is attached to an optical unit during the procedure for manufacturing the camera module.

After applying the adhesive, the table moving mechanism 33 is actuated to move the solid-state imaging device 5 in the Z-axis direction so that the assembly reference surface 16a abuts on the protrusion 19 such as shown in FIG. 9. The adhesive hardens after a prescribed period to fasten the solid-state imaging device 5 to the optical unit 4. At the next fifth step, plastic sealing is carried out by injecting the melted plastic 7 between the optical unit 4 and the FPC 6, and further between the solid-state imaging device 5 and the FPC 6.

By the way, the adhesive may be applied to the protrusion 19 of the optical unit 4 in advance before setting the optical unit 4 and the solid-state imaging device 5 to the assembly apparatus. In another way, the adhesive may be applied to a joint portion of the optical unit 4 and the solid-state imaging device 5 after positioning and combining them.

As described above, assembling is carried out so as to make the photographic optical axis E of the imaging lens 3 coincide with the center of the light-receiving elements of the solid-state imaging device 5. Thus, deterioration of a light amount and resolution, shading to be caused by unevenness of sensitivity, and so forth are prevented from occurring. Moreover, since the assembly reference surface 16a of the terminal non-forming area 16 of the solid-state imaging device 5 has the accurate flatness, the solid-state imaging device 5 is prevented from being attached to the optical unit 4 in a slant state. Further, it is unnecessary to perform an aligning operation in that positional adjustment is carried out while confirming an output picture of the solid-state imaging device 5. Thus, it is possible to extremely decrease manufacture time and the cost of the camera module 2.

Another embodiment of the solid-state imaging device and the camera module is described below. The respective section views of the solid-state imaging device used in the following description are taken along the X-direction shown in FIG. 1. With respect to the respective section views of the camera module, a left side of the photographic optical axis E is a section view in the X-direction, and a right side thereof is a section view in the Y-direction. By the way, a component being identical with that of the above-described embodiment is denoted by the same reference numeral, and description thereof is abbreviated.

Figure 10:
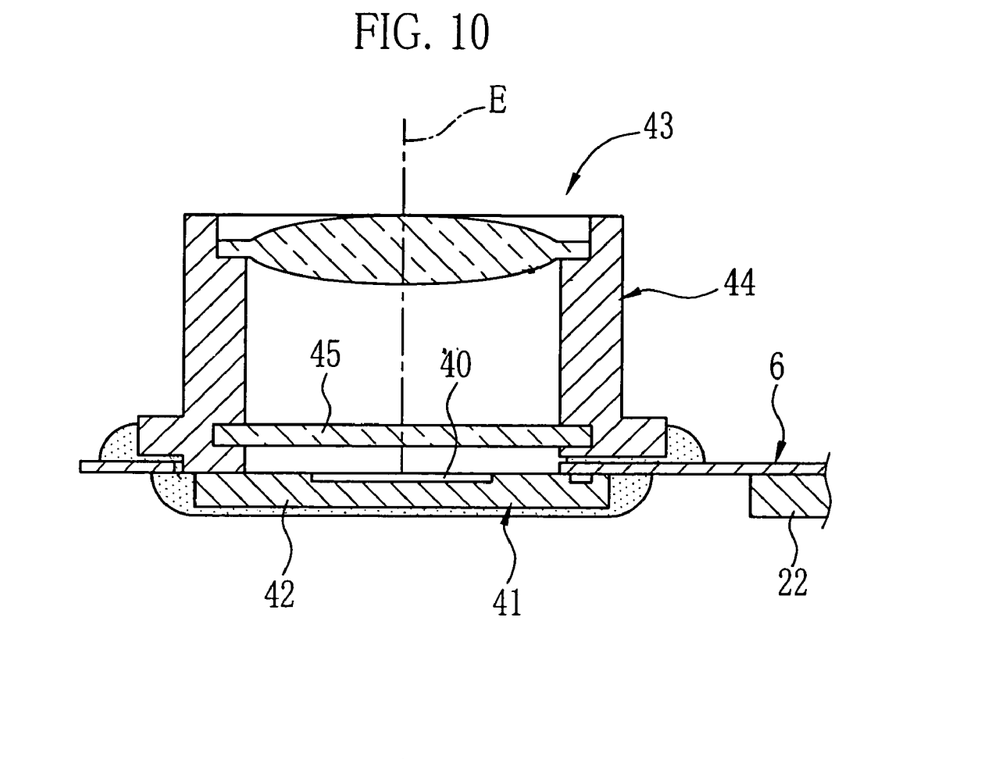
FIG. 10 is partial section view showing a camera module of a second embodiment according to the present invention.

FIG. 10 shows an embodiment wherein a camera module 43 employs a solid-state imaging device 41 of a bare-chip state in that a light-receiving element 40 is not covered with a cover glass. With respect to this solid-state imaging device 41, a semiconductor substrate 42 has a broader upper surface to be used for assembly with an optical unit 44. Thus, it is possible to combine the solid-state imaging device 41 and the optical unit 44 with great accuracy. Incidentally, a cover glass 45 for covering the light-receiving element 40 may be contained in the optical unit 44 for the purpose of protecting the light-receiving element 40.

Figure 11:
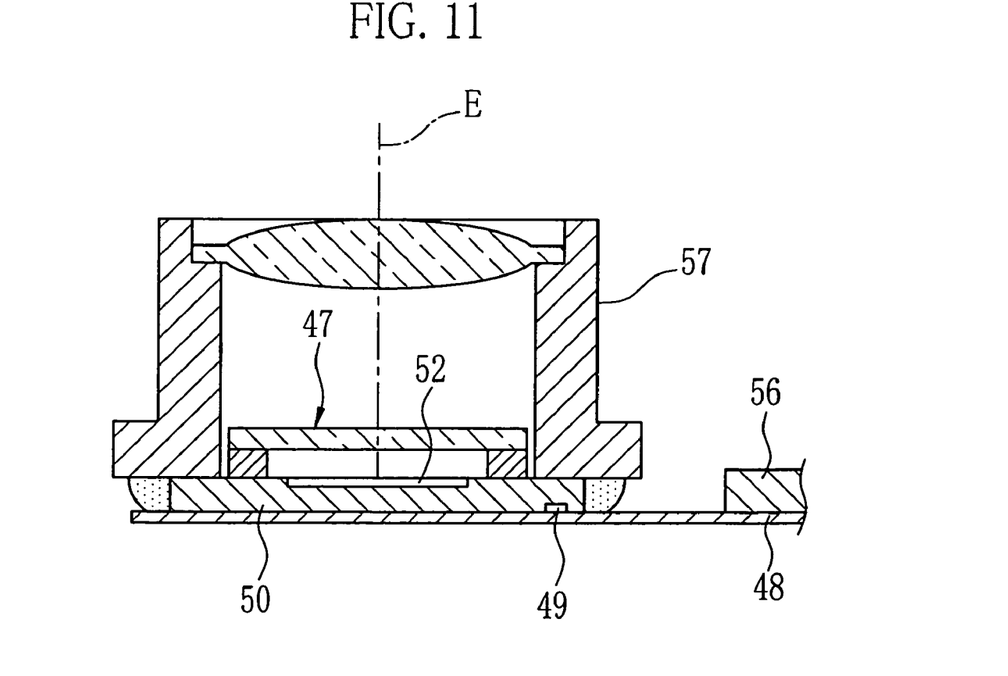
FIG. 11 is a partial section view showing a camera module of a third embodiment according to the present invention.

In the above embodiments, the FPC 6 is disposed between the solid-state imaging device and the optical unit. However, such as shown in FIG. 11, an FPC 48 may be attached to a lower surface of a solid-state imaging device 47. By doing so, the whole upper surface of the solid-state imaging device 47 may be used for attachment to an optical unit 57. Further, in this case, it is possible to reduce a size of a camera module in the direction of the photographic optical axis E by mounting the IC 56 on an upper surface of the FPC 48.

Figure 12:
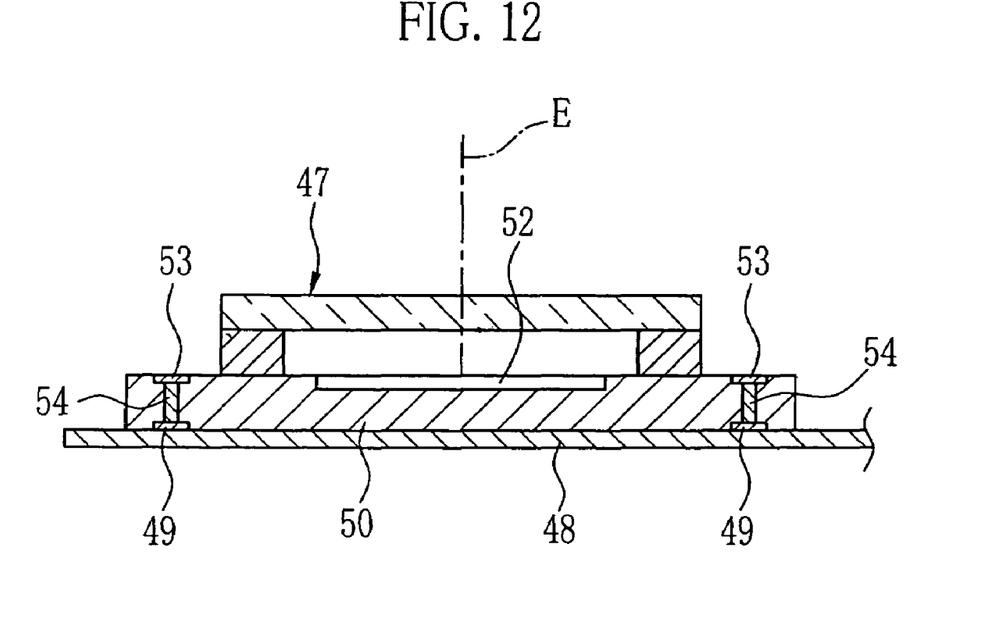
FIG. 12 is a partial section view showing a solid-state imaging device used in the camera module of the third embodiment.

In this embodiment, it is preferable to form an external connection terminal 49 in a lower surface of a semiconductor substrate 50 of the solid-state imaging device 47 for the purpose of electrically connecting the solid-state imaging device 47 and the FPC 48 in an easy manner. In order to connect a light-receiving element 52 to the external connection terminal 49 of the lower surface, a through wiring 54 may be used such as illustrated in FIG. 12 showing a section view of the solid-state imaging device 47. The through wiring 54 is formed such that conductive paste is loaded in a through hole formed under an external connection terminal 53 of the upper surface of the semiconductor substrate 50. The external connection terminal 49 comprising an Au bump is formed under the through wiring 54 so that the light-receiving element 52 and the external connection terminal 49 are electrically connected.

Figure 13:
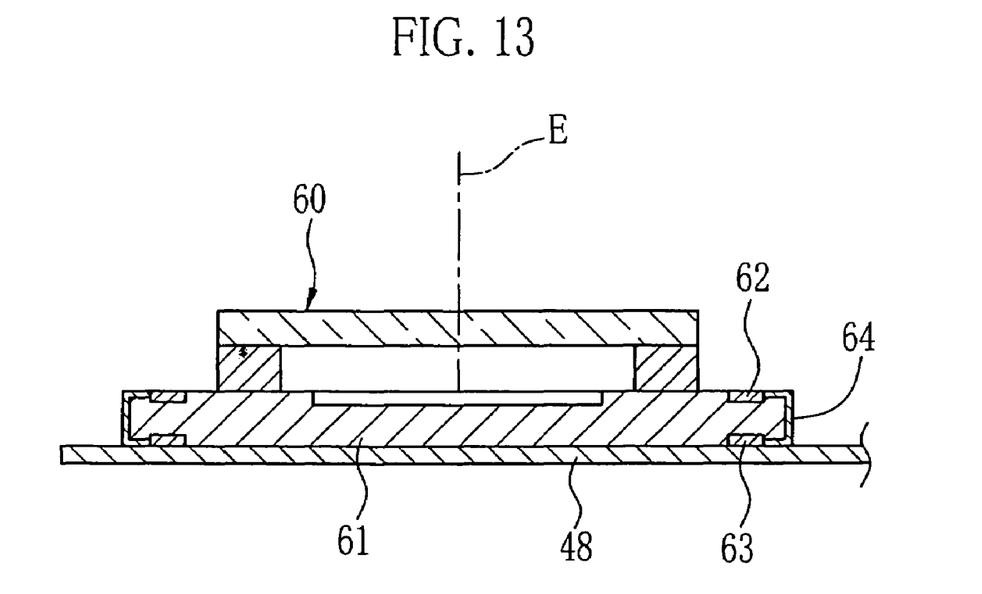
FIG. 13 is a partial section view showing another solid-state imaging device used in the camera module of the third embodiment.

Alternatively, as illustrated in FIG. 13 showing a section view of a solid-state imaging device 60, a surface wiring may be formed on a side surface of a semiconductor substrate 61 instead of the through wiring. The surface wiring connects external connection terminals 62 and 63 of an upper surface and a lower surface.

Figure 14:
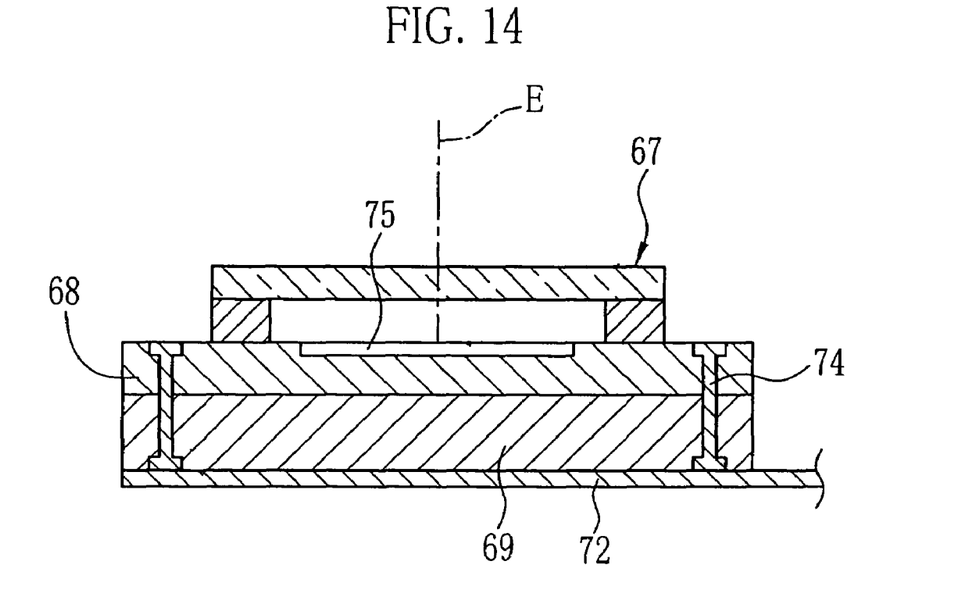
FIG. 14 is a partial section view showing a solid-state imaging device used in a camera module of a fourth embodiment according to the present invention.
Figure 15:
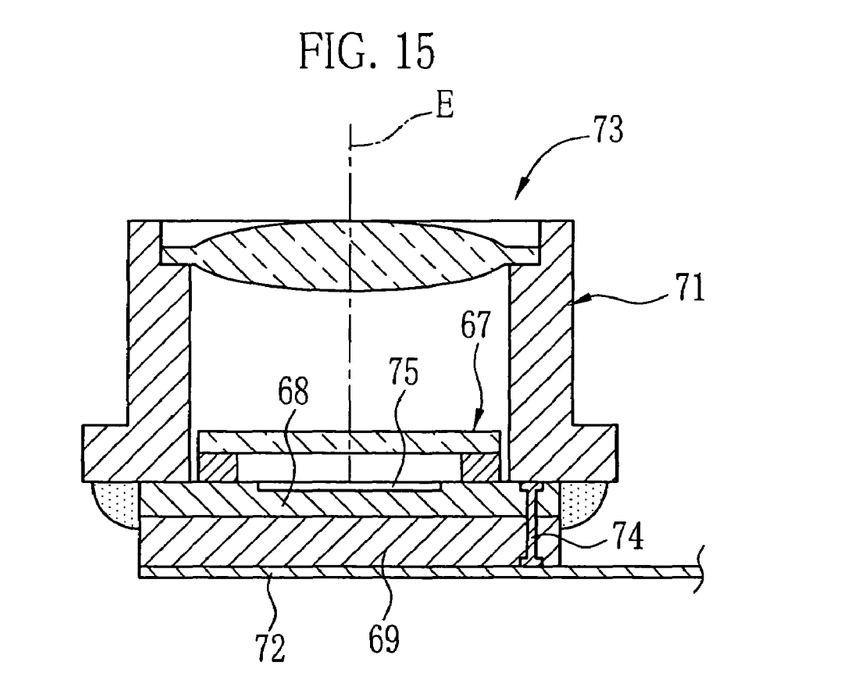
FIG. 15 is a partial section view showing the camera module of the fourth embodiment.

In the forgoing embodiments, the analog front end IC 22 is mounted on the FPC. However, such as shown in FIG. 14, an IC 69 may be mounted on a lower surface of a semiconductor substrate 68 of a solid-state imaging device 67. In other words, the IC 69 being as an electronic component may be mounted on the other surface of the semiconductor substrate opposite to the surface on which the light-receiving element is formed. In this case, such as shown in FIG. 15, a project area of a camera module 73 including an optical unit 71 and an FPC 72 may be extremely reduced on a plane being perpendicular to the photographic optical axis E. Moreover, a wiring distance between a light-receiving element 75 and the IC 69 becomes shorter by adopting a through wiring 74 so that it is possible to fasten an operation of the solid-state imaging device 67. Incidentally, also in this embodiment, a surface wiring formed on a side surface of the semiconductor substrate 68 may be used instead of the through wiring.

Figure 16:
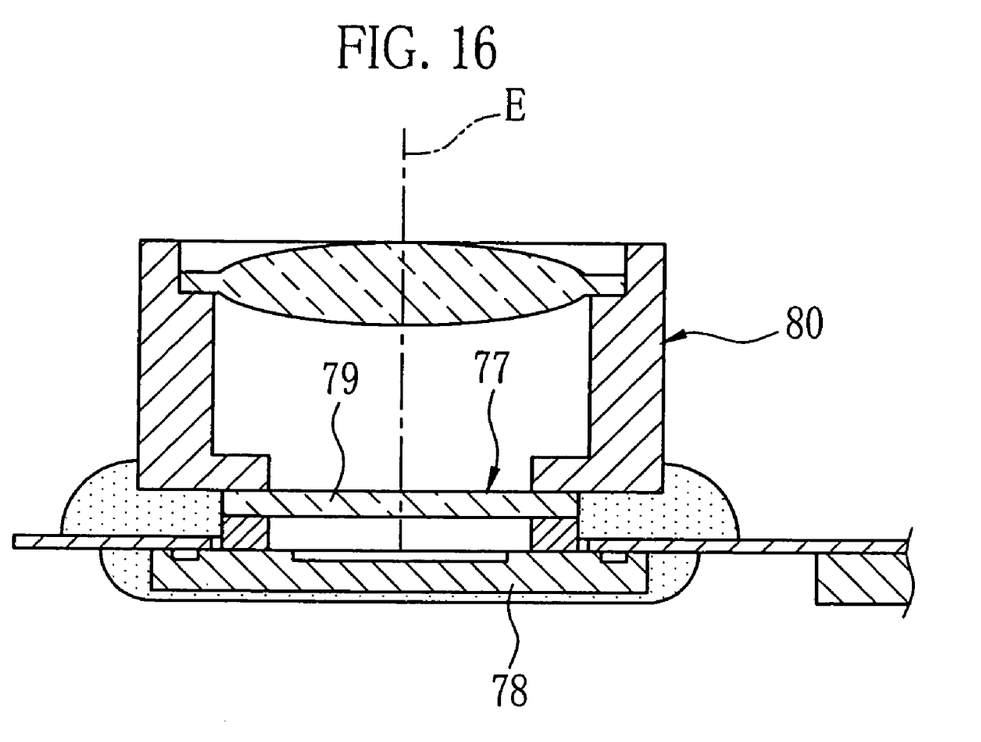
FIG. 16 is a partial section view showing a camera module of a fifth embodiment according to the present invention.

In the forgoing embodiments, the assembly reference surface is provided within the terminal non-forming area of the solid-state imaging device to attach the optical unit. However, such as shown in FIG. 16, an optical unit 80 may be attached to a cover glass 79 fixed to a semiconductor substrate 78 of a solid-state imaging device 77. The cover glass 79 for the solid-state imaging device 77 having the CSP structure keeps flatness being identical with that of a wafer, which is a base of the semiconductor substrate 78. When the cover glass 79 is fixed to the semiconductor substrate 78, an upper surface (assembly reference surface) of the semiconductor substrate 78 is utilized as a reference plane so that the cover glass 79 is prevented from being slantingly fixed. Thus, it is possible to attach the optical unit 80 to the solid-state imaging device 77 with equal accuracy in comparison with the case in that the optical unit is attached to the semiconductor substrate.

In the first embodiment, the optical unit 4 is manufactured so as to set the photographic optical axis E of the imaging lens 3 to the predetermined position. However, in accordance with a result of determining the photographic optical axis E of the imaging lens 3, the solid-state imaging device 5 may be positioned when the solid-state imaging device 5 is attached to the optical unit 4.

In the forgoing embodiments, the description is made under the specific combinations regarding the position of the external connection terminal, the wiring manner between the light-receiving element and the external connection terminal, the attachment position of the FPC relative to the solid-state imaging device, the arrangements of the FPC in the flat state and in the bending state, the attachment position of the IC, the attachment position of the optical unit relative to the solid-state imaging device, the procedure for manufacturing the solid-state imaging device and the optical unit, and so forth. However, these combinations are not limited to the above embodiments of the present invention. It is possible to adopt proper combinations in accordance with usage manners and so forth of the solid-state imaging device and the camera module.

Further, the solid-state imaging device employed in the camera module of the respective forgoing embodiments may be used, as it is, in various electronic equipment of a digital camera and so forth. The present invention is not limited to the camera module, and may be also utilized for manufacturing the other optical units.

Although the present invention has been fully described by way of the preferred embodiments thereof with reference to the accompanying drawings, various changes and modifications will be apparent to those having skill in this field. Therefore, unless otherwise these changes and modifications depart from the scope of the present invention, they should be construed as included therein.

What is claimed is:

1. A camera module comprising:
  a solid-state imaging device including a semiconductor substrate, on a first surface of which light-receiving elements are formed;
  an optical unit having a built-in photographic optical system for forming a subject image on said light-receiving elements;
  an electronic component for driving said solid-state imaging device, a first surface of said electronic component being attached to a second surface of said semiconductor substrate, which is opposite to said first surface of said semiconductor substrate, and said electronic component being electrically connected to said solid-state imaging device; and
  a circuit board provided with a circuit for driving said solid-state imaging device, said circuit board being attached to a second surface of said electronic component, which is opposite to said first surface of said electronic component, and said circuit board being electrically connected to said solid-state imaging device, wherein said first surface of said semiconductor substrate is used as an assembly reference plane when said solid-state imaging device and said optical unit are combined.

2. A camera module according to claim 1, wherein said optical unit is directly attached to said first surface of said semiconductor substrate.

3. A camera module according to claim 1, further comprising:

a translucent member attached to said first surface of said semiconductor substrate, said translucent member covering only the light-receiving elements.

4. A camera module according to claim 3, wherein said optical unit is directly attached to said first surface.

5. A camera module according to claim 3, wherein said translucent member has flatness being identical with that of said semiconductor substrate.

6. A camera module according to claim 5, wherein said optical unit is attached to said translucent member.

7. A camera module according to claim 1, wherein said circuit board is a flexible printed circuit board, which is folded to be disposed under said solid-state imaging device.

8. A camera module according to claim 1, further comprising an opening formed in said circuit board, said opening exposing said translucent member and said assembly reference plane of said semiconductor substrate, wherein said translucent member is disposed within said opening and breaks the plane of said opening.

9. A camera module according to claim 1, wherein a photographic optical axis of said photographic optical system coincides with a center of said light-receiving elements.

* * * * *